United States Patent
Oshima et al.

(10) Patent No.: US 11,563,176 B2
(45) Date of Patent: Jan. 24, 2023

(54) COMPOSITION FOR HOLE COLLECTING LAYER OF ORGANIC PHOTOELECTRIC CONVERSION ELEMENT

(71) Applicant: NISSAN CHEMICAL CORPORATION, Tokyo (JP)

(72) Inventors: Juro Oshima, Funabashi (JP); Shun Sugawara, Funabashi (JP); Takuji Yoshimoto, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 802 days.

(21) Appl. No.: 16/464,619

(22) PCT Filed: Dec. 1, 2017

(86) PCT No.: PCT/JP2017/043253
§ 371 (c)(1),
(2) Date: May 28, 2019

(87) PCT Pub. No.: WO2018/110317
PCT Pub. Date: Jun. 21, 2018

(65) Prior Publication Data
US 2021/0098703 A1  Apr. 1, 2021

(30) Foreign Application Priority Data

Dec. 16, 2016 (JP) .............................. JP2016-244291
Dec. 16, 2016 (JP) .............................. JP2016-244337

(51) Int. Cl.
| | | |
|---|---|---|
| *H01L 51/00* | (2006.01) | |
| *C09D 7/45* | (2018.01) | |
| *C09D 7/63* | (2018.01) | |
| *C08G 73/02* | (2006.01) | |
| *C08K 5/42* | (2006.01) | |
| *C08K 5/5419* | (2006.01) | |
| *C09D 5/24* | (2006.01) | |
| *C09D 179/02* | (2006.01) | |
| *H01L 51/42* | (2006.01) | |

(52) U.S. Cl.
CPC ...... *H01L 51/0035* (2013.01); *C08G 73/0266* (2013.01); *C08K 5/42* (2013.01); *C08K 5/5419* (2013.01); *C09D 5/24* (2013.01); *C09D 7/45* (2018.01); *C09D 7/63* (2018.01); *C09D 179/02* (2013.01); *H01L 51/005* (2013.01); *H01L 51/0036* (2013.01); *H01L 51/0046* (2013.01); *H01L 51/0094* (2013.01); *H01L 51/424* (2013.01)

(58) Field of Classification Search
CPC .................................................. H01L 51/0035
See application file for complete search history.

(56) References Cited

U.S. PATENT DOCUMENTS

| | | | |
|---|---|---|---|
| 5,589,108 A | 12/1996 | Shimizu et al. | |
| 6,611,096 B1 | 8/2003 | McCormick et al. | |
| 7,341,678 B2 * | 3/2008 | Kato ...................... | H01B 1/128 |
| | | | 252/301.16 |
| 10,020,449 B2 * | 7/2018 | Oshima ............... | H01L 51/0094 |
| 11,018,303 B2 * | 5/2021 | Otani ...................... | H01B 1/124 |
| 2008/0246853 A1 | 10/2008 | Takizawa et al. | |

(Continued)

FOREIGN PATENT DOCUMENTS

| | | |
|---|---|---|
| JP | 2003-509816 A | 3/2003 |
| JP | 2003-234460 A | 8/2003 |

(Continued)

OTHER PUBLICATIONS

International Search Report (PCT/ISA/210) issued in PCT/JP2017/043253, dated Feb. 20, 2018.
Li et al., "Polymer solar cells," Nature Photonics vol. 6, 2012, pp. 153-161.
Lim et al., "Organic-on-silicon complementary metal-oxide-semiconductor colour image sensors," Scientific Reports, vol. 5: 7708, 2015, pp. 1-7.
O'Regan et al., "A low-cost, high-efficiency solar cell based on dye-sensitized colloidal TiO2 films," Nature, vol. 353, 1991, pp. 737-740.

(Continued)

*Primary Examiner* — William D Young
(74) *Attorney, Agent, or Firm* — Birch, Stewart, Kolasch & Birch, LLP

(57) ABSTRACT

This composition for a hole collecting layer of an organic photoelectric conversion element contains: a charge-transporting substance comprising a polyaniline derivative represented by formula (1); a fluorine-based surfactant; and a solvent. The composition provides a thin film suitable for a hole collecting layer of an organic photoelectric conversion element, and is particularly suited for producing an inverse lamination type organic photoelectric conversion element.

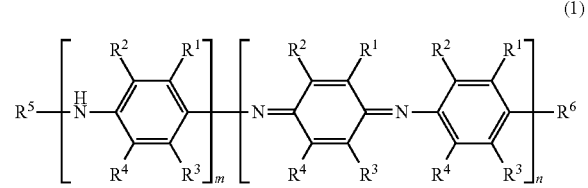

(1)

(In the formula, $R^1$ to $R^6$ each independently represent a hydrogen atom, etc., but one of $R^1$ to $R^4$ is a sulfonic acid group, one or more of the remaining $R^1$ to $R^4$ are a C1-20 alkoxy group, a C1-20 thioalkoxy group, a C1-20 alkyl group, a C2-20 alkenyl group, a C2-20 alkynyl group, a C1-20 haloalkyl group, a C6-20 aryl group, or a C7-20 aralkyl group, and m and n are numbers which satisfy $0 \leq m \leq 1$, $0 \leq n \leq 1$ and $m+n=1$).

24 Claims, No Drawings

(56) References Cited

U.S. PATENT DOCUMENTS

| | | | |
|---|---|---|---|
| 2015/0225589 A1* | 8/2015 | Ohori | C09D 11/10 |
| | | | 252/500 |
| 2016/0196892 A1 | 7/2016 | Ohori et al. | |
| 2016/0315266 A1 | 10/2016 | Oshima et al. | |
| 2017/0104161 A1 | 4/2017 | Otani | |
| 2018/0002539 A1* | 1/2018 | Higashi | C08K 5/3435 |

FOREIGN PATENT DOCUMENTS

| | | |
|---|---|---|
| JP | 2008-258474 A | 10/2008 |
| JP | 2011-138813 A | 7/2011 |
| JP | 2015-129265 A | 7/2015 |
| KR | 10-0362018 B1 | 3/2003 |
| WO | WO 2012/078517 A1 | 6/2012 |
| WO | WO 2014/119782 A1 | 8/2014 |
| WO | WO 2015/087797 A1 | 6/2015 |
| WO | WO 2015/186688 A1 | 12/2015 |
| WO | WO 2016/148184 A1 | 9/2016 |

OTHER PUBLICATIONS

Tang, "Two-layer organic photovoltaic cell," Appl. Phys. Lett., vol. 48, 1986, pp. 183-185.
Written Opinion of the International Searching Authority (PCT/ISA/237) issued in PCT/JP2017/043253, dated Feb. 20, 2018.
Extended European Search Report dated Oct. 28, 2019, in European Patent Application No. 17882030.4.
Korean Office Action for Korean Application No. 10-2019-7019443, dated Jan. 27, 2022.

* cited by examiner

COMPOSITION FOR HOLE COLLECTING LAYER OF ORGANIC PHOTOELECTRIC CONVERSION ELEMENT

TECHNICAL FIELD

The present invention relates to a composition for a hole collecting layer of an organic photovoltaic element.

BACKGROUND ART

An organic photovoltaic element is a device that converts light energy into electric energy by using an organic semiconductor, and includes, for example, an organic solar cell.

An organic solar cell is a solar cell element using an organic material in an active layer and a charge transporting substance, and a dye sensitized solar cell developed by M. Grätzel and an organic thin-film solar cell developed by C. W. Tang are well known (Non-Patent Documents 1 and 2).

Both of them are different from currently mainstream inorganic solar cells in terms of features, for example, they are lightweight, thin and flexible, and can be produced by roll-to-roll processes. Therefore, new market formation is expected.

Among them, organic thin-film solar cells have features such as electrolyte free and heavy metal compound free, and, recently, have been reported to have a photoelectric conversion efficiency (hereinafter abbreviated as PCE) of 10.6% by the group of UCLA and others. For such reasons, organic thin-film solar cells are attracting great attention (Non-Patent Document 3).

On the other hand, organic thin-film solar cells are drawing attention not only for solar cell applications but also for applications of optical sensors such as image sensors because of their features of showing a high photoelectric conversion efficiency even at low illuminance and enabling element thinning and pixel refining, as compared with photovoltaics using existing silicon-based materials, and being able to have the properties of color filters as well (Patent Documents 1 and 2, and Non-Patent Document 4). Hereinafter, those involving applications of optical sensors and the like, in addition to organic solar cells (dye sensitized solar cells and organic thin-film solar cells), are generically referred to as organic photovoltaic (hereinafter sometimes abbreviated as OPV) element.

The organic photovoltaic element is configured so as to include an active layer (photovoltaic layer), a charge (hole, electron) collecting layer, an electrode (anode, cathode), and the like.

Among these, the active layer and the charge collecting layer are generally formed by a vacuum deposition method, but the vacuum deposition method is problematic in terms of complexity due to mass production process, increase in cost of apparatus, utilization efficiency of materials, etc.

From these points, a water dispersible polymer organic conductive material such as PEDOT/PSS is used as a coating type material for a hole collecting layer, in some cases. However, the material is an aqueous dispersion, and thus has problems of difficulty in completely removing moisture and controlling moisture reabsorption and easiness in accelerating the deterioration of the element.

Moreover, the PEDOT/PSS aqueous dispersion has the property that the solid content tends to aggregate, and thus has problems of easily causing defects in the coating film and easily causing clogging and corrosion in the coating apparatus. Further, it is unsatisfactory in heat resistance, and various issues in mass production remain.

PRIOR ART DOCUMENTS

Patent Documents

Patent Document 1: JP-A 2003-234460
Patent Document 2: JP-A 2008-258474

Non-Patent Documents

Non-patent document 1: Nature, vol. 353, 737-740 (1991)
Non-patent document 2: Appl. Phys. Lett., Vol. 48, 183-185 (1986)
Non-patent document 3: Nature Photonics Vol. 6, 153-161 (2012)
Non-patent document 4: Scientific Reports, Vol. 5: 7708, 1-7(2015)

SUMMARY OF INVENTION

Technical Problem

The present invention has been made in view of the above circumstances, and an object thereof is to provide a composition for a hole collecting layer of an organic photovoltaic element which provides a thin film suitable for a hole collecting layer of an organic photovoltaic element, and is particularly suitable for production of an inverse lamination type organic photovoltaic element.

Solution to Problem

As a result of intensive studies to achieve the above object, the present inventors found that a polymer containing, as a repeating unit, an anilinesulfonic acid or a derivative thereof substituted with a predetermined electron donating substituent such as an alkoxy group exhibits high hole transporting property, and also exhibits high solubility in protic polar solvents such as alcohols and water having low corrosiveness to the active layer to form a uniform solution, which is used to form a thin film through a coating process; that, when the resulting thin film is used as a hole collecting layer of an OPV element, an OPV element showing a good PCE with a high yield can be obtained; that the addition of an electron accepting dopant substance composed mainly of a Brønsted acid having high oxidizing power at the time of preparation of the solution enables control of the HOMO level of the resultant thin film, which enables efficient collection and transport of holes, with the result that an OPV element exhibiting a higher PCE and high durability can be obtained; that the electron blocking property can be imparted to the resultant thin film by adding an appropriate amount of an alkoxysilane-based material of an appropriate type to the solution; and that a fluorine-based surfactant is added to the solution, thereby giving a composition for a hole collecting layer excellent in film formability onto the active layer and suitable for production of an inverse lamination type organic photovoltaic element, and completed the present invention.

Specifically, the present invention provides:
1. A composition for a hole collecting layer of an organic photovoltaic element. including: a charge transporting substance composed of a polyaniline derivative represented by formula (1); a fluorine-based surfactant; and a solvent:

[Chem. 1]

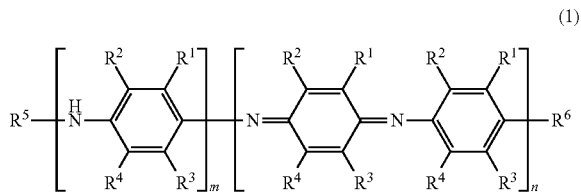
(1)

wherein $R^1$ to $R^6$ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, an aralkyl group having 7 to 20 carbon atoms or an acyl group having 1 to 20 carbon atoms, provided that one of $R^1$ to $R^4$ is a sulfonic acid group, and that at least one of the remaining $R^1$ to $R^4$ is an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms or an aralkyl group having 7 to 20 carbon atoms, and m and n are numbers satisfying $0 \leq m \leq 0.1$ and $0 \leq n \leq 1$, respectively, and $m+n=1$;

2. The composition for a hole collecting layer according to 1, including an alkoxysilane;

3. The composition for a hole collecting layer of an organic photovoltaic element according to 1 or 2, wherein the fluorine-based surfactant is a fluorine-based nonionic surfactant;

4. The composition for a hole collecting layer of an organic photovoltaic element according to 3, wherein the fluorine-based nonionic surfactant is at least one selected from the following formulas (A2) and (B2):

[Chem. 2]

$R_f COO(CH_2CH_2O)_n H$                       (A2)

$R_f (CH_2CH_2O)_n H$                            (B2)

wherein $R_f$ each independently represents a perfluoroalkyl group having 1 to 40 carbon atoms, and n each independently represents an integer of 1 to 20;

5. The composition for a hole collecting layer of an organic photovoltaic element according to any one of 1 to 4, wherein $R^1$ is a sulfonic acid group, and $R^4$ is an alkoxy group having 1 to 20 carbon atoms;

6. The composition for a hole collecting layer of the organic photovoltaic element according to any one of 1 to 5, including an electron accepting dopant substance different from the polyaniline derivative represented by formula (1);

7. The composition for a hole collecting layer of an organic photovoltaic element according to 6, wherein the electron accepting dopant substance is a Brønsted acid;

8. The composition for a hole collecting layer of an organic photovoltaic element according to 7, wherein the electron accepting dopant substance is an arylsulfonic acid compound represented by formula (2):

[Chem. 3]

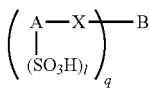
(2)

wherein X represents O, A represents a naphthalene ring or an anthracene ring, B represents a divalent to tetravalent perfluorobiphenyl group, l represents the number of sulfonic acid groups bonded to A and is an integer satisfying $1 \leq l \leq 4$, and q represents the number of bonds between B and X and is an integer satisfying 2 to 4;

9. The composition for a hole collecting layer of an organic photovoltaic element according to any one of 1 to 8, wherein the solvent includes one or more solvents selected from alcohol solvents and water;

10. The composition for a hole collecting layer of an organic photovoltaic element according to any one of 1 to 9, wherein the organic photovoltaic element is an organic thin-film solar cell, a dye sensitized solar cell or an optical sensor;

11. A hole collecting layer prepared by using the composition for a hole collecting layer of an organic photovoltaic element according to any one of 1 to 10;

12. An organic photovoltaic element including the hole collecting layer according to 11;

13. An organic photovoltaic element including the hole collecting layer according to 11 and an active layer provided so as to be in contact therewith;

14. The organic photovoltaic element according to 12 or 13, wherein the active layer includes a fullerene derivative;

15. The organic photovoltaic element according to 12 or 13, wherein the active layer includes a polymer containing a thiophene skeleton in its main chain;

16. The organic photovoltaic element according to 12 or 13, wherein the active layer includes a fullerene derivative and a polymer containing a thiophene skeleton in its main chain:

17. The organic photovoltaic element according to any one of 12 to 16, which is an inverse lamination type;

18. The organic photovoltaic element according to any one of 12 to 17, wherein the organic photovoltaic element is an organic thin-film solar cell or an optical sensor.

19. The organic photovoltaic element according to any one of 12 to 18, which has a top anode structure;

20. A charge transporting composition including: a charge transporting substance composed of a polyaniline derivative represented by formula (1); an electron accepting dopant substance different from the polyaniline derivative represented by formula (1); a fluorine-based surfactant; and a solvent:

[Chem. 4]

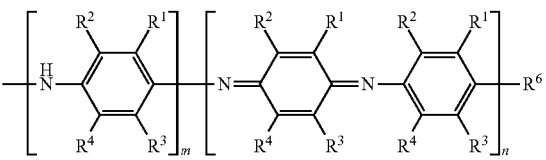
(1)

wherein $R^1$ to $R^6$ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, an aralkyl group having 7 to 20 carbon atoms or an acyl group having 1 to 20 carbon atoms, provided that one of $R^1$ to $R^4$ is a sulfonic acid group, and that at least one of the remaining $R^1$ to $R^4$ is an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms or an aralkyl group having 7 to 20 carbon atoms, and m and n are numbers satisfying 0 S m: 1 and 0:5 n: 1, respectively, and m+n=1;

21. The charge transporting composition according to 20, including an alkoxysilane; and 22. The charge transporting composition according to 20 or 21, wherein the electron accepting dopant substance is an arylsulfonic acid compound represented by formula (2):

[Chem. 5]

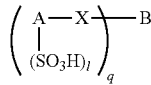

(2)

wherein X represents O, A represents a naphthalene ring or an anthracene ring, B represents a divalent to tetravalent perfluorobiphenyl group, l represents the number of sulfonic acid groups bonded to A and is an integer satisfying 1≤l≤4, and q represents the number of bonds between B and X and is an integer satisfying 2 to 4.

Advantageous Effects of Invention

The composition for a hole collecting layer of an organic photovoltaic element according to the present invention can be produced using a charge transporting substance composed of a polyaniline derivative which can be obtained inexpensively in the market or can be easily synthesized by a known method. In addition, when a thin film obtained from the composition is used as a hole collecting layer, an organic thin-film solar cell excellent in PCE can be obtained. Further, since a highly uniform thin film can be formed by using the composition for a hole collecting layer according to the present invention, it is possible to suppress current leakage by using this highly uniform thin film as a hole collecting layer, and to keep reverse bias dark current low. Therefore, it is possible to apply the thin film made of the composition for a hole collecting layer according to the present invention to an element structure similar to the organic thin-film solar cell and to convert a few photons into electrons for detection. Thus, the hole collecting layer obtained from the composition is also applicable to optical sensor applications such as high performance image sensor applications.

Further, the charge transporting substance composed of the polyaniline derivative used in the present invention is excellent in solubility in protic polar solvents such as alcohols and water, and the composition can be prepared using the solvents which hardly adversely affect the active layer. Besides, since a film can be easily formed on the active layer due to the incorporation of a fluorine-based surfactant, it is suitable also for production of an inverse lamination type organic thin-film solar cell.

Furthermore, an OPV element exhibiting a higher PCE and high durability can be obtained by adding an electron accepting dopant substance composed of a Brønsted acid.

DESCRIPTION OF EMBODIMENTS

Hereinafter, the present invention is described in more detail.

The composition for a hole collecting layer of an organic photovoltaic element according to the present invention includes a charge transporting substance composed of a polyaniline derivative represented by formula (1), a fluorine-based surfactant, and a solvent:

[Chem. 6]

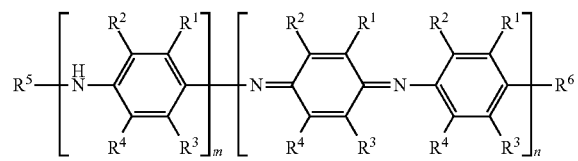

(1)

In the formula (1), $R^1$ to $R^6$ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, an aralkyl group having 7 to 20 carbon atoms or an acyl group having 1 to 20 carbon atoms, provided that one of $R^1$ to $R^4$ is a sulfonic acid group, and that at least one of the remaining $R^1$ to $R^4$ is an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms or an aralkyl group having 7 to 20 carbon atoms.

Examples of the halogen atom include a fluorine atom, a chlorine atom, a bromine atom, and an iodine atom.

Specific examples of the alkyl group having 1 to 20 carbon atoms include chain alkyl groups having 1 to 20 carbon atoms such as a methyl group, an ethyl group, an n-propyl group, isopropyl group, n-butyl group, an isobutyl group, an s-butyl group, a t-butyl group, an n-pentyl group, an n-hexyl group, an n-heptyl group, an n-octyl group, an n-nonyl group and an n-decyl group; and cyclic alkyl groups having 3 to 20 carbon atoms such as a cyclopropyl group, a cyclobutyl group, a cyclopentyl group, a cyclohexyl group, a cycloheptyl group, a cyclooctyl group, a cyclononyl group, a cyclodecyl group, a bicyclobutyl group, a bicyclopentyl group, a bicyclohexyl group, a bicycloheptyl group, a bicyclooctyl group, a bicyclononyl group, and a bicyclodecyl group.

Specific examples of the alkenyl group having 2 to 20 carbon atoms include an ethenyl group, an n-1-propenyl group, an n-2-propenyl group, a 1-methylethenyl group, an n-1-butenyl group, an n-2-butenyl group, an n-3-butenyl group, a 2-methyl-1-propenyl group, a 2-methyl-2-propenyl group, a 1-ethylethenyl group, a 1-methyl-1-propenyl group, a 1-methyl-2-propenyl group, an n-1-pentenyl group, an n-1-decenyl group, and an n-1-eicosenyl group.

Specific examples of the alkynyl group having 2 to 20 carbon atoms include an ethynyl group, an n-1-propynyl group, an n-2-propynyl group, an n-1-butynyl group, an n-2-butynyl group, an n-3-butynyl group, a 1-methyl-2-propynyl group, an n-1-pentynyl group, an n-2-pentynyl group, an n-3-pentynyl group, an n-4-pentynyl group, a 1-methyl-n-butynyl group, a 2-methyl-n-butynyl group, a 3-methyl-n-butynyl group, a 1,1-dimethyl-n-propynyl group, an n-1-hexynyl group, an n-1-decynyl group, an n-1-pentadecynyl group, and an n-1-eicosinyl group.

Specific examples of the alkoxy group having 1 to 20 carbon atoms include a methoxy group, an ethoxy group, an n-propoxy group, an i-propoxy group, a c-propoxy group, an n-butoxy group, an i-butoxy group, an s-butoxy group, a t-butoxy group, an n-pentoxy group, an n-hexoxy group, an n-heptyloxy group, an n-octyloxy group, an n-nonyloxy group, an n-decyloxy group, an n-undecyloxy group, an n-dodecyloxy group, an n-tridecyloxy group, an n-tetradecyloxy group, an n-pentadecyloxy group, an n-hexadecyloxy group, an n-heptadecyloxy group, an n-octadecyloxy group, an n-nonadecyloxy group, and an n-eicosanyloxy group.

Specific examples of the thioalkoxy group having 1 to 20 carbon atoms include groups in which the oxygen atom of the above alkoxy group is substituted with a sulfur atom.

Specific examples of the thioalkoxy (alkylthio) group having 1 to 20 carbon atoms include a methylthio group, an ethylthio group, an n-propylthio group, an isopropylthio group, an n-butylthio group, an isobutylthio group, an s-butylthio group and a t-butylthio group, an n-pentylthio group, an n-hexylthio group, an n-heptylthio group, an n-octylthio group, an n-nonylthio group, an n-decylthio group, an n-undecylthio group, an n-dodecylthio group, an n-tridecylthio group, an n-tetradecylthio group, an n-pentadecylthio group, an n-hexadecylthio group, an n-heptadecylthio group, an n-octadecylthio group, an n-nonadecylthio group, and an n-eicosanylthio group.

Examples of the haloalkyl group having 1 to 20 carbon atoms include groups in which at least one of the hydrogen atoms in the above alkyl group is substituted with a halogen atom. The halogen atom may be any of chlorine, bromine, iodine and fluorine atoms. Among them, a fluoroalkyl group is preferable, and a perfluoroalkyl group is more preferable.

Specific examples thereof include a fluoromethyl group, a difluoromethyl group, a trifluoromethyl group, a pentafluoroethyl group, a 2,2,2-trifluoroethyl group, a heptafluoropropyl group, a 2,2,3,3,3-pentafluoropropyl group, a 2,2,3,3-tetrafluoropropyl group, a 2,2,2-trifluoro-1-(trifluoromethyl) ethyl group, a nonafluorobutyl group, a 4,4,4-trifluorobutyl group, an undecafluoropentyl group, a 2,2,3,3,4,4,5,5,5-nonafluoropentyl group, a 2,2,3,3,4,4,5,5-octafluoropentyl group, a tridecafluorohexyl group, a 2,2,3,3,4,4,5,5,6,6,6-undecafluorohexyl group, a 2,2,3,3,4,4,5,5,6,6-decafluorohexyl group, and a 3,3,4,4,5,5,6,6,6-nonafluorohexyl group.

Specific examples of the aryl group having 6 to 20 carbon atoms include a phenyl group, a 1-naphthyl group, a 2-naphthyl group, a 1-anthryl group, a 2-anthryl group, a 9-anthryl group, a 1-phenanthryl group, a 2-phenanthryl group, a 3-phenanthryl group, a 4-phenanthryl group, and a 9-phenanthryl group.

Specific examples of the aralkyl group having 7 to 20 carbon atoms include a benzyl group, a p-methylphenylmethyl group, an m-methylphenylmethyl group, an o-ethylphenylmethyl group, an m-ethylphenylmethyl group, a p-ethylphenylmethyl group, a 2-propylphenylmethyl group, a 4-isopropylphenylmethyl group, a 4-isobutylphenylmethyl group, and an α-naphthylmethyl group.

Specific examples of the acyl group having 1 to 20 carbon atoms include a formyl group, an acetyl group, a propionyl group, a butyryl group, an isobutyryl group, a valeryl group, an isovaleryl group, and a benzoyl group.

As described above, in the polyaniline derivative of formula (1) used in the present invention, one of $R^1$ to $R^4$ is a sulfonic acid group, and at least one of the remaining $R^1$ to $R^4$, preferably any one of the remaining $R^1$ to $R^4$ is an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, or an aralkyl group having 7 to 20 carbon atoms, which is an electron donating group. In particular, an alkoxy having 1 to 20 carbon atoms, a thioalkoxy group having 1 to 20 carbon atoms, or an alkyl group having 1 to 20 carbon atoms is preferable, an alkoxy group having 1 to 20 carbon atoms is more preferable, and an alkoxy group having 1 to 10 carbon atoms is still more preferable.

The substitution position is not particularly limited, but, in the present invention, $R^1$ is preferably a sulfonic acid group, and $R^4$ is preferably an alkoxy having 1 to 20 carbon atoms.

Furthermore, all of $R^2$, $R^3$, $R^5$ and $R^6$ are preferably hydrogen atoms.

In formula (1), m and n are numbers satisfying $0 \leq m \leq 1$ and $0 \leq n \leq 1$, respectively, and $m+n=1$. In consideration of further enhancement of the conductivity of the resultant hole collecting layer, $0 < n < 1$ is preferable, and $0.1 \leq n \leq 0.9$ is more preferable.

The weight average molecular weight of the polyaniline derivative represented by formula (1) is not particularly limited. However, in consideration of the conductivity, the lower limit is usually 200 or more, preferably 1,000 or more. In consideration of the improvement in solubility in the solvent, the upper limit is usually 5,000,000 or less, preferably 500,000 or less. In addition, the weight average molecular weight is a value in terms of polystyrene by gel permeation chromatography.

In the composition of the present invention, the polyaniline derivative represented by formula (1) may be used alone, or two or more compounds may be used in combination.

Moreover, a commercial product or a product obtained by polymerization of an aniline derivative or the like as a starting material through a well-known method may be used as the polyaniline derivative represented by formula (1). In either case, a product purified by a method such as reprecipitation or ion exchange is preferably used. By using a purified product, the properties of an OPV element provided with a thin film obtained from a composition containing the compound can be further enhanced.

In the organic thin-film solar cell, the ionization potential of the hole collecting layer is preferably a value close to the ionization potential of the p-type semiconductor material in the active layer. The absolute value of the difference is preferably 0 to 1 eV, more preferably 0 to 0.5 eV, still more preferably 0 to 0.2 eV.

Therefore, the composition for a hole collecting layer according to the present invention may contain an electron accepting dopant substance for the purpose of adjusting the ionization potential of the charge transporting thin film obtained by using this.

The electron accepting dopant substance is not particularly limited as long as it dissolves in at least one solvent used.

Specific examples of the electron accepting dopant material include inorganic strong acids such as hydrogen chloride, sulfuric acid, nitric acid and phosphoric acid; Lewis acids such as aluminum (III) chloride ($AlCl_3$), titanium tetrachloride (IV) ($TiCl_4$), boron tribromide ($BBr_3$), boron trifluoride ether complex ($BF_3 \cdot OEt_2$), iron (III) chloride ($FeCl_3$), copper (II) chloride ($CuCl_2$), antimony pentachloride (V) ($SbCl_5$), arsenic pentafluoride (V) (AsF), phosphorus pentafluoride (PFs) and tris (4-bromophenyl) aluminum hexachloroantimonate (TBPAH); organic strong acids such as benzenesulfonic acid, tosylic acid, camphorsulfonic acid, hydroxybenzenesulfonic acid, 5-sulfosalicylic acid, dodecylbenzenesulfonic acid, polystyrenesulfonic acid, the 1,4-benzodioxanedisulfonic acid compound described in WO 2005/000832, the arylsulfonic acid compound described in WO 2006/025342, the dinonylnaphthalenesulfonic acid described in JP-A 2005-108828 and 1,3,6-naphthalenetrisulfonic acid; organic oxidants such as 7,7,8,8-tetracyanoquinodimethane (TCNQ), 2,3-dichloro-5,6-dicyano-1,4-benzoquinone (DDQ) and iodine; and inorganic oxidants including heteropoly acid compounds such as the phosphomolybdic acid described in WO 2010/058777, phosphotungstic acid and phosphotungstomolybdic acid. These substances may be used alone, or two or more thereof may be used in combination.

Among the above various electron accepting dopant substances, particularly, a Brønsted acid which donates $H^+$ is preferable, an arylsulfonic acid compound is more preferable, and an arylsulfonic acid compound represented by formula (2) is particularly preferable, in the present invention:

[Chem. 7]

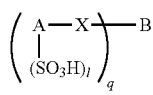
(2)

wherein X represents O, A represents a naphthalene ring or an anthracene ring, B represents a divalent to tetravalent perfluorobiphenyl group, l represents the number of sulfonic acid groups bonded to A and is an integer satisfying $1 \leq l \leq 4$, and q represents the number of bonds between B and X and is an integer satisfying 2 to 4.

Examples of the arylsulfonic acid compound that can be suitably used in the present invention include the following compound (formula (2-1)).

[Chem. 8]

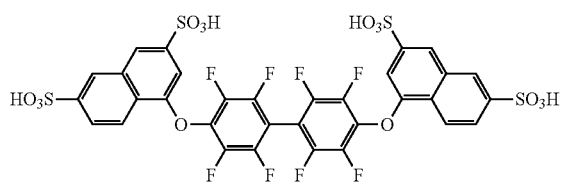
(2-1)

Furthermore, the composition of the present invention includes a fluorine-based surfactant.

The fluorine-based surfactant is not particularly limited as long as it contains a fluorine atom, and any of cationic, anionic and nonionic surfactants may be used, but a fluorine-based nonionic surfactant is suitable. In particular, at least one fluorine-based nonionic surfactant selected from the following formulas (A1) and (B1) is preferable:

[Chem. 9]

(A1)

(B1)

In the above formula, R represents a monovalent organic group containing a fluorine atom, and n represents an integer of 1 to 20.

Specific examples of the organic group include an alkyl group having 1 to 40 carbon atoms, an aryl group having 6 to 20 carbon atoms, an aralkyl group having 7 to 20 carbon atoms, and a heteroaryl group having 2 to 20 carbon atoms.

Specific examples of the heteroaryl group include a 2-thienyl group, a 3-thienyl group, a 2-furanyl group, a 3-furanyl group, a 2-oxazolyl group, a 4-oxazolyl group, a 5-oxazolyl group, a 3-isoxazolyl group, a 4-isoxazolyl group, a 5-isoxazolyl group, a 2-thiazolyl group, a 4-thiazolyl group, a 5-thiazolyl group, a 3-isothiazolyl group, a 4-isothiazolyl group, a 5-isothiazolyl group, a 2-imidazolyl group, a 4-imidazolyl group, a 2-pyridyl group, a 3-pyridyl group, a 4-pyridyl group, a 2-pyrazyl group, a 3-pyrazyl group, a 5-pyrazyl group, a 6-pyrazyl group, a 2-pyrimidyl group, a 4-pyrimidyl group, a 5-pyrimidyl group, a 6-pyrimidyl group, a 3-pyridadyl group, a 4-pyridadyl group, a 5-pyridadyl group, a 6-pyridadyl group, a 1,2,3-triazin-4-yl group, a 1,2,3-triazin-5-yl group, a 1,2,4-triazin-3-yl group, a 1,2,4-triazin-5-yl group, a 1,2,4-triadin-6-yl group, and a 1,3,5-triazin-2-yl group.

In addition, specific examples of the alkyl group, the aryl group and the aralkyl group include the same ones as described above.

The above n is not particularly limited as long as it is an integer of 1 to 20, but is more preferably an integer of 1 to 10.

Among these substances, at least one fluorine-based nonionic surfactant selected from perfluoroalkylpolyoxyethylene esters of the following formula (A2) and perfluoroalkylpolyoxyethylene ethers of the following formula (B2) each having a perfluoroalkyl group $R_f$ having 1 to 40 carbon atoms, and fluorotelomer alcohols is more preferable:

[Chem. 10]

(A2)

(B2)

wherein n represents the same meaning as described above.

The fluorine-based surfactant used in the present invention is available as a commercial product.

Examples of such a commercial product include Capstone (registered trademark) FS-10, FS-22, FS-30, FS-31, FS-34, FS-35, FS-50, FS-51, FS-60, FS-61, FS-63, FS-64, FS-65, FS-66, FS-81, FS-83 and FS-3100 manufactured by Du Pont; and NOIGEN FN-1287 manufactured by DKS Co., Ltd., but it is not limited thereto.

In particular, Capstone FS-30, FS-31, FS-34, FS-35 and FS-3100 and NOIGEN FN-1287, which are nonionic surfactants, are suitable.

In the composition of the present invention, the content of the fluorine-based surfactant is not particularly limited, but, in consideration of the balance between the improvement in film formability on the active layer and the decrease in photoelectric conversion efficiency due to the addition, is preferably 0.05 to 10% by weight, more preferably 0.05 to 5.0% by weight, still more preferably 0.07 to 2.0% by weight, further preferably 0.10 to 1.0% by weight based on the entire composition.

Furthermore, the composition of the present invention preferably contains an alkoxysilane. The incorporation of an alkoxysilane can improve the solvent resistance and water resistance of the resultant thin film and the electron blocking property, and can also provide optimum values of the HOMO level and the LUMO level for the active layer. The alkoxysilane may be a siloxane-based material.

As the alkoxysilane, any one or more alkoxysilanes selected from tetraalkoxysilanes, trialkoxysilanes and dialkoxysilanes can be used. Tetraethoxysilane, tetramethoxysilane, phenyltriethoxysilane, phenyltrimethoxysilane, methyltriethoxysilane, methyltrimethoxysilane, 3,3,3-trifluoropropyltrimethoxysilane, dimethyldiethoxysilane and dimethyldimethoxysilane are preferable, and tetraethoxysilane is more preferable.

Examples of the siloxane-based material include polysiloxanes such as poly(tetraethoxysilane) and poly(phenylethoxysilane) which are obtained by a reaction such as hydrolysis to the above alkoxysilane.

The amount of the alkoxysilane to be added is not particularly limited as long as the above effects can be exhibited, but is preferably 0.0001 to 100 times, more preferably 0.01 to 50 times, more preferably 0.05 to 10 times, in weight ratio, with respect to the polyaniline derivative used in the present invention.

In the composition of the present invention, other additives may be blended as long as the object of the present invention can be achieved.

The kinds of additives to be used can be appropriately selected from known ones according to the desired effects.

As the solvent used for preparation of the composition for a hole collecting layer, highly dissolving solvents capable of dissolving the polyaniline derivative and the electron accepting dopant substance well can be used. The highly dissolving solvents can be used singly or in combination of two or more, and the amount thereof to be used can be set to 5 to 100% by weight based on the entire solvent to be used in the composition.

Examples of such highly dissolving solvents include water, and organic solvents including alcohol solvents such as ethanol, 2-propanol, 1-butanol, 2-butanol, s-butanol, t-butanol and 1-methoxy-2-propanol; and amide-based solvents such as N-methylfomamide, N,N-dimethylformamide, N,N-diethylformamide, N-methylacetamide, N,N-dimethylacetamide, N-methylpyrrolidone and 1,3-dimethyl-2-imidazolidinone.

Among these, at least one selected from water and alcohol solvents is preferable, and water, ethanol or 2-propanol is more preferable.

In particular, when used to form a hole collecting layer of an inverse lamination type OPV, a solvent consisting only of one or more solvents selected from alcohol solvents and water, which does not adversely affect the active layer, is preferably used.

The charge transporting substance and the electron accepting dopant substance are preferably both completely dissolved or uniformly dispersed in the above-mentioned solvent. In consideration of obtaining, with good reproducibility, a hole collecting layer which provides an organic thin-film solar cell having a high conversion efficiency, it is more preferable that these substances be completely dissolved in the above solvent.

In addition, the composition for a hole collecting layer according to the present invention may contain at least one high-viscosity organic solvent having a viscosity of 10 to 200 mPa·s, particularly 35 to 150 mPa·s at 25° C. and a boiling point of 50 to 300° C., especially 150 to 250° C. at normal pressure, in order to improve the film formability and the dischargeability from a coating apparatus.

The high-viscosity organic solvent is not particularly limited. For example, cyclohexanol, ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol can be indicated.

The addition ratio of the high-viscosity organic solvent to the entire solvent used in the composition of the present invention is preferably in the range in which no solid precipitates. The addition ratio is preferably 5 to 80% by weight as long as no solid precipitates.

Furthermore, for the purpose of improving the wettability to the coating surface, adjusting the surface tension of the solvent, adjusting the polarity, adjusting the boiling point, etc., any other solvent capable of imparting film flatness during heat treatment can be mixed in a proportion of 1 to 90% by weight, preferably 1 to 50% by weight based on the entire solvent to be used in the composition.

Examples of such solvents include butyl cellosolve, diethylene glycol diethyl ether, diethylene glycol dimethyl ether, diethylene glycol monoethyl ether acetate, diethylene glycol monobutyl ether acetate, dipropylene glycol monomethyl ether, propylene glycol monomethyl ether, propylene glycol monomethyl ether acetate, ethyl carbitol, diacetone alcohol, γ-butyrolactone, ethyl lactate, and n-hexyl acetate.

The solid content concentration of the composition of the present invention is appropriately set in consideration of the viscosity and surface tension of the composition, the thickness of the thin film to be produced, etc., but is usually about 0.1 to 10.0% by weight, preferably 0.5 to 5.0% by weight, more preferably 1.0 to 3.0% by weight.

In addition, the weight ratio of the electron accepting dopant substance to the charge transporting substance is also appropriately set in consideration of the charge transporting property to be exhibited, the kind of charge transporting substance, etc. Usually, the weight ratio of the electron accepting dopant substance is 0 to 10, preferably 0.1 to 3.0, more preferably 0.2 to 2.0 per 1 of the charge transporting substance.

The viscosity of the composition for a hole collecting layer used in the present invention is appropriately adjusted in accordance with the coating method in consideration of the thickness of the thin film to be produced and the solid content concentration, and is usually about 0.1 mPa·s to 50 mPa·s at 25° C.

In preparing the composition of the present invention, the charge transporting substance, the electron accepting dopant substance, the solvent and the like can be mixed in an arbitrary order as long as the solid content is uniformly dissolved or dispersed in the solvent. That is, for example, any of a method which involves dissolving the polyaniline derivative in the solvent and then dissolving the electron accepting dopant substance in the solution, a method which involves dissolving the electron accepting dopant substance in the solvent and then dissolving the polyaniline derivative in the solution, a method which involves mixing the polyaniline derivative and the electron accepting dopant substance and then introducing and dissolving the mixture in the solvent can be employed as long as the solid content is uniformly dissolved or dispersed in the solvent.

The fluorine-based surfactant and the alkoxysilane may also be added in an arbitrary order.

In general, the preparation of the composition is carried out in an inert gas atmosphere at normal temperature and pressure, but may be carried out either in an atmospheric air (in the presence of oxygen) or while heating unless the compounds in the composition are decomposed or the composition is greatly changed.

The hole collecting layer of the present invention can be formed by applying the composition described above onto an anode in the case of a normal lamination type organic thin-film solar cell, and onto the active layer in the case of an inverse lamination type organic thin-film solar cell.

In coating, an optimum method may be adopted from various wet process methods such as drop casting, spin coating, blade coating, dip coating, roll coating, bar coating, die coating, ink jet methods and printing methods (letterpress, intaglio, lithography, screen printing, etc.), in consideration of the viscosity and surface tension of the composition, the desired thickness of the thin film, etc.

In general, coating is carried out in an inert gas atmosphere at normal temperature and pressure, but may be carried out either in an atmospheric air (in the presence of oxygen) or while heating unless the compounds in the composition are decomposed or the composition is greatly changed.

The film thickness is not particularly limited, but, in any case, is preferably about 0.1 to 500 nm, more preferably about 1 to 100 nm. As a method of changing the film thickness, a method such as changing the solid content concentration in the composition or changing the amount of solution during coating is indicated.

Hereinafter, methods for producing an organic thin-film solar cell using the composition for forming a hole collecting layer according to the present invention are described, but the present invention is not limited thereby.

(1) Normal Lamination Type Organic Thin-Film Solar Cell

[Formation of Anode Layer]:

Step of forming a layer of anode material on the surface of a transparent substrate to produce a transparent electrode As the anode material, inorganic oxides such as indium tin oxide (ITO) and indium zinc oxide (IZO), metals such as gold, silver and aluminum, and highly charge transporting organic compounds such as polythiophene derivatives and polyaniline derivatives can be used. Among these, ITO is most preferred. Further, as the transparent substrate, a substrate made of glass or a transparent resin can be used.

The method for forming a layer of anode material (anode layer) is appropriately selected according to the properties of the anode material. Usually, a dry process such as vacuum deposition or sputtering is selected in the case of a poorly soluble or poorly dispersible sublimable material, and, in the case of a solution material or an aqueous dispersion material, an optimum method is adopted from the various wet process methods described above, in consideration of the viscosity and surface tension of the composition, the desired thickness of the thin film, etc.

Moreover, a commercially available transparent anode substrate can also be used, and, in this case, it is preferable to use a smoothed substrate from the viewpoint of improving the yield of the element. When a commercially available transparent anode substrate is used, the method for producing an organic thin-film solar cell according to the present invention does not include any step of forming an anode layer.

When forming a transparent anode substrate using an inorganic oxide such as ITO as the anode material, it is preferable to wash it with a detergent, an alcohol, pure water or the like before laminating an upper layer before use. Furthermore, it is preferable to perform surface treatment such as UV ozone treatment or oxygen-plasma treatment immediately before use. When the anode material contains an organic material as a main component, no surface treatment may be performed.

[Formation of Hole Collecting Layer]:

Step of forming a hole collecting layer on the layer of anode material formed

In accordance with the above method, the composition of the present invention is used to form a hole collecting layer on the layer of anode material.

[Formation of Active Layer]:

Step of forming an active layer on the hole collecting layer formed

The active layer may be either a laminate of a thin-film n-layer made of an n-type semiconductor material and a thin-film p-layer made of a p-type semiconductor material or a non-laminate thin film made of a mixture of these materials.

Examples of the n-type semiconductor material include fullerene, [6,6]-phenyl-$C_{61}$-butyric acid methyl ester ($PC_{61}BM$), and [6,6]-phenyl-$C_{71}$-butyric acid methyl ester ($PC_{71}BM$). On the other hand, examples of the p-type semiconductor materials include polymers containing a thiophene skeleton in its main chain, such as regioregular poly(3-hexylthiophene) (P3HT), PTB7 represented by the following formula (4), and polymers containing a thienothiophene unit as described in JP-A 2009-158921 and WO 2010/008672; phthalocyanines such as CuPC and ZnPC; and porphyrins such as tetrabenzoporphyrin.

[Chem. 11]

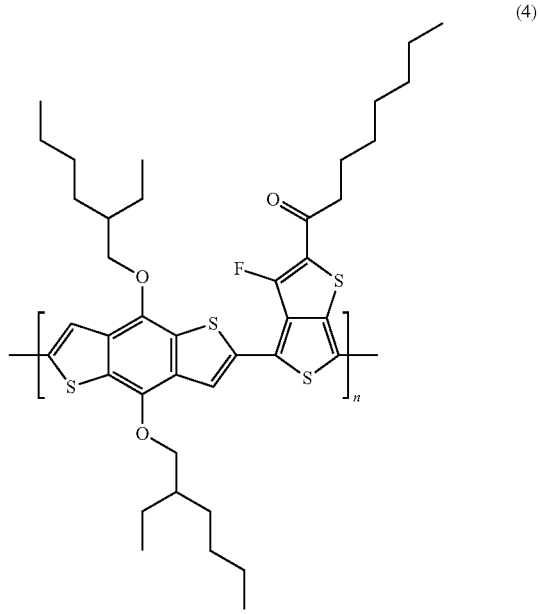

(4)

Among these materials, $PC_{61}BM$ and $PC_{71}BM$ are preferable as the n-type material, and polymers containing a thiophene skeleton in its main chain such as PTB7 are preferable as the p-type material.

The term "thiophene backbone in its main chain" as used herein refers to a divalent aromatic ring consisting only of thiophene, or a divalent fused aromatic ring containing one or more thiophenes such as thienothiophene, benzothiophene, dibenzothiophene, benzodithiophene, naphthothiophene, naphthodithiophene, anthrathiophene and anthradithiophene, which may be substituted with the substituents represented by the above $R^1$ to $R^6$.

Also as for the method for forming the active layer, similarly as described above, various dry processes as described above are selected in the case where the active layer material is a poorly soluble sublimable material, and, in the case where it is a solution material or an aqueous dispersion material, an optimum method is adopted from the various wet process methods described above, in consideration of the viscosity and surface tension of the composition, the desired thickness of the thin film, etc.

[Formation of Electron Collecting Layer]:

Step of forming an electron collecting layer on the active layer formed

If necessary, an electron collecting layer may be formed between the active layer and a cathode layer for the purpose of improving the efficiency of charge transfer and the like.

Examples of materials for forming the electron collecting layer include lithium oxide ($Li_2O$), magnesium oxide (MgO), alumina ($Al_2O_3$), lithium fluoride (LiF), sodium fluoride (NaF), magnesium fluoride ($MgF_2$), srontium fluoride ($SrF_2$), cesium carbonate ($Cs_2CO_3$), 8-quinolinol lithium salt (Liq), 8-quinolinol sodium salt (Naq), vasocuproin (BCP), 4,7-diphenyl-1,10-phenanthroline (BPhen), polyethyleneimine (PEI) and ethoxylated polyethyleneimine (PEIE).

Also as for the method for forming the electron collecting layer, similarly as described above, various dry processes as described above are selected in the case where the electron collection material is a poorly soluble sublimable material, and, in the case where it is a solution material or an aqueous dispersion material, an optimum method is adopted from the various wet process methods described above, in consideration of the viscosity and surface tension of the composition, the desired thickness of the thin film, etc.

[Formation of Cathode Layer]:

Step of forming a cathode layer on the electron collecting layer formed

Examples of the cathode material include metals such as aluminum, magnesium-silver alloy, aluminum-lithium alloy, lithium, sodium, potassium, cesium, calcium, barium, silver and gold; organic compounds such as indium tin oxide (ITO) and indium zinc oxide (IZO); and highly charge transporting compounds such as polythiophene derivatives and polyaniline derivatives. A plurality of cathode materials can be laminated or mixed and used.

Also as for the method for forming the cathode layer, similarly as described above, various dry processes as described above are selected in the case where the cathode layer material is a poorly soluble or poorly dispersible sublimable material, and, in the case where it is a solution material or an aqueous dispersion material, an optimum method is adopted from the various wet process methods described above, in consideration of the viscosity and surface tension of the composition, the desired thickness of the thin film, etc.

[Formation of Carrier Blocking Layer]

If necessary, a carrier blocking layer may be provided between arbitrary layers for the purpose of controlling the rectifying property of the photocurrent or the like. When providing a carrier blocking layer, generally, an electron blocking layer is inserted between the active layer and the hole collecting layer or the anode, and a hole blocking layer is inserted between the active layer and the electron collecting layer or the cathode, in many cases, but the present invention is not limited thereto.

Examples of the material for forming the hole blocking layer include titanium oxide, zinc oxide, tin oxide, vasocuproin (BCP), and 4,7-diphenyl 1,10-phenanthroline (BPhen).

Examples of the material for forming the electron blocking layer include triarylamines such as N,N'-di (1-naphthyl)-N,N'-diphenylbenzidine (α-NPD), and poly(triarylamine) (PTAA).

Also as for the method for forming the carrier blocking layer, similarly as described above, various dry processes as described above are selected in the case where the carrier blocking layer material is a poorly soluble or poorly dispersible sublimable material, and, in the case where it is a solution material or an aqueous dispersion material, an optimum method is adopted from the various wet process methods described above, in consideration of the viscosity and surface tension of the composition, the desired thickness of the thin film, etc.

(2) Inverse Lamination Type Organic Thin-Film Solar Cell

[Formation of Cathode Layer]:

Step of forming a layer of cathode material on the surface of a transparent substrate to produce a transparent cathode substrate Examples of the cathode material include fluorine-doped tin oxide (FTO) in addition to those exemplified for the anode material of the normal lamination type organic thin-film solar cell mentioned above, and examples of the transparent substrate include those exemplified above as the anode materials for the normal lamination type organic thin-film solar cell.

Also as for the method for forming the layer of cathode material (cathode layer), dry processes as described above are selected in the case where the cathode layer material is a poorly soluble or poorly dispersible sublimable material, and, in the case where it is a solution material or an aqueous dispersion material, an optimum method is adopted from the various wet process methods described above, in consideration of the viscosity and surface tension of the composition, the desired thickness of the thin film, etc.

Also in this case, a commercially available transparent cathode substrate can be suitably used, and it is preferable to use a smoothed substrate from the viewpoint of improving the yield of the element. When a commercially available transparent cathode substrate is used, the method for producing an organic thin-film solar cell according to the present invention does not include the step of forming a cathode layer.

When an inorganic oxide is used as the cathode material to form a transparent cathode substrate, washing treatment or surface treatment similar to that used for the anode material of the normal lamination type organic thin-film solar cell may be applied.

[Formation of Electron Collecting Layer]:

Step of forming an electron collecting layer on the cathode formed

If necessary, an electron collecting layer may be formed between the active layer and a cathode layer for the purpose of improving the efficiency of charge transfer and the like.

Examples of the material for forming the electron collecting layer include zinc oxide (ZnO), titanium oxide (TiO), tin oxide (SnO), and the like, in addition to those exemplified above as the materials for the normal lamination type organic thin-film solar cell.

Also as for the method for forming the electron collecting layer, dry processes as described above are selected in the case where the cathode layer material is a poorly soluble or poorly dispersible sublimable material, and, in the case where it is a solution material or an aqueous dispersion material, an optimum method is adopted from the various wet process methods described above, in consideration of the viscosity and surface tension of the composition, the desired thickness of the thin film, etc. Alternatively, a method for forming a precursor layer of an inorganic oxide on the cathode by a wet process (in particular, spin coating or slit coating) and firing it to form a layer of inorganic oxide.

[Formation of Active Layer]:
Step of forming an active layer on the electron collecting layer formed The active layer may be either a laminate of a thin-film n-layer made of an n-type semiconductor material and a thin-film p-layer made of a p-type semiconductor material or a non-laminate thin film made of a mixture of these materials.

Examples of n-type and p-type semiconductor materials include the same ones as exemplified above as the semiconductor materials for the normal lamination type organic thin-film solar cell, and examples of n-type materials include $PC_{61}BM$ and $PC_{71}BM$, and p-type materials such as PTB7. Polymers containing a thiophene backbone in its main chain are preferred.

The method for forming the active layer is also the same as the method described above for the active layer of the normal lamination type organic thin-film solar cell.

[Formation of Hole Collecting Layer]:
Step of forming a hole collecting layer on the layer of active layer material formed According to the method described above, the composition of the present invention is used to form a hole collecting layer on the layer of active layer material.

[Formation of Anode Layer]:
Step of forming an anode layer on the hole collecting layer formed Examples of the anode material include the same ones as exemplified above as the anode material for the normal lamination type organic thin-film solar cell. The method for forming the anode layer is the same as the method for forming the cathode layer of the normal lamination type organic thin-film solar cell.

[Formation of Carrier Blocking Layer]
As is the case with a normal lamination type element, a carrier blocking layer may be provided between arbitrary layers for the purpose of controlling the rectifying property of the photocurrent or the like, if necessary.

Examples of the material for forming the hole blocking layer and the material for forming the electron blocking layer include the same ones as exemplified above, and the method for forming the carrier blocking layer is also the same as described above.

The OPV element prepared by the method exemplified above is introduced again into the glove box and sealed in an inert gas atmosphere such as nitrogen in order to prevent the deterioration of the element due to the atmosphere. In a sealed state, the element can function as a solar cell, and measurement of solar cell properties can be performed.

Examples of the sealing method include a method that involves allowing a concave glass substrate having a UV curable resin attached to the end part to adhere to the film forming surface side of an organic thin-film solar cell element in an inert gas atmosphere and curing the resin by UV irradiation and a method in which sealing of film-seal type is carried out by a technique such as sputtering under vacuum.

EXAMPLES

The present invention is described in more detail below with reference to Examples and Comparative Examples, but the present invention is not limited to the following Examples.

In addition, the apparatuses used are as follows.
(1) NMR
  Apparatus: ECX-300 manufactured by JEOL Ltd.
  Measurement solvent: dimethylsulfoxide-d6 manufactured by Junsei Chemical Co., Ltd.
(2) Glove box: VAC glove box system manufactured by YAMAHACHI & Co., Ltd.
(3) Vapor deposition system: vacuum deposition system manufactured by Aoyama Engineering K.K.
(4) Solar simulator: OTENTOSUN-III, AM 1.5 G filter, radiation intensity: 100 mW/cm$^2$, manufactured by Bunkoukeiki Co., Ltd.
(5) Source measure unit: 2612A, manufactured by Keithley Instruments KK
(6) GPC
  Apparatus: HLC-8320GPC Eco SEC manufactured by Tosoh Corporation
  Column: TSKgel G3000PWXL manufactured by Tosoh Corporation
  Column temperature: 40° C.
  Eluent: 100 mM aqueous sodium nitrate solution
  Liquid feeding rate: 0.5 mL/min
  Detector: UV (254 nm)
  Calibration curve: standard sodium polystyrene sulfonate (manufactured by Aldrich Co.)
(7) Film thickness measuring apparatus:
  Surfcorder ET-4000 manufactured by Kosaka Laboratory, Ltd.
(8) Ionization potential measuring apparatus:
  AC-3 manufactured by Riken Keiki Co., Ltd.

[1] Preparation 1 of Active Layer Composition

Preparation Example 1

In a sample vial containing 20 mg of PTB 7 (manufactured by 1-Material) and 30 mg of $PC_{61}BM$ (manufactured by Frontier Carbon Corporation, product name: nanom spectra E 100), 2.0 mL of chlorobenzene was added, and the vial contents were stirred on a hot plate at 80° C. for 15 hours. The resulting solution was allowed to cool to room temperature. Then, 60 L of 1,8-diiodooctane (manufactured by Tokyo Chemical Industry Co., Ltd.) was added, and the mixture was stirred to obtain a solution A1 (active layer composition).

[2] Synthesis of Polymethoxyaniline Sulfonic Acid

Synthesis Example 1

A solution 1 was obtained by dissolving 20 mmol of o-anisidine-5-sulfonic acid and 20 mmol of triethylamine in 9 mL of a mixed solvent containing 4.5 mL of distilled water and 4.5 mL of acetonitrile at room temperature. Subsequently, a solution 2 in which 20 mmol of ammonium peroxodisulfate and 1.1 g of 98% concentrated sulfuric acid were dissolved in 18 mL of a mixed solvent containing 9 mL of distilled water and 9 mL of acetonitrile was cooled to 0° C., and the solution 1 was added dropwise thereto over 30 minutes.

After completion of the dropwise addition, the reaction solution was further stirred at 25° C. for 1 hour, and then the reaction product was separated by suction filtration. The solid collected by filtration was washed with 200 mL of methyl alcohol and then vacuum dried to give 2.78 g of a green powder of polymethoxyaniline sulfonic acid.

The weight average molecular weight of the resultant polymer, when measured by GPC, was 1,366.

[3] Production 1 of Composition for Hole Collecting Layer

Example 1-1

In 24.3 g of distilled water, 750 mg of polymethoxyaniline sulfonic acid obtained in Synthesis Example 1 was dissolved to prepare a brown solution having a concentration of 3.0% by weight. To the resultant brown solution, a fluorine-based nonionic surfactant (FS-30, manufactured by Du Pont) was added in an amount of 0.1% by weight based on the entire brown solution. The solution was filtered through a syringe filter having a pore size of 0.45 μm, thereby giving a composition B1 for a hole collecting layer.

Example 1-2

In 24.6 g of distilled water, 375 mg of the polymethoxyaniline sulfonic acid obtained in Synthesis Example 1 was dissolved to prepare a brown solution having a concentration of 1.5% by weight. To the resultant brown solution, a fluorine-based nonionic surfactant (FS-30, manufactured by Du Pont) was added in an amount of 0.1% by weight based on the entire brown solution. The solution was filtered through a syringe filter having a pore size of 0.45 μm, thereby giving a composition B2 for a hole collecting layer.

Example 1-3

In 24.6 g of distilled water, 250 mg of the polymethoxyaniline sulfonic acid obtained in Synthesis Example 1 and 125 mg of arylsulfonic acid compound A of the above formula (2-1) synthesized based on the description of WO 2006/025342 were dissolved to prepare a brown solution having a concentration of 1.5% by weight. To the resultant brown solution, a fluorine-based nonionic surfactant (FS-30, manufactured by Du Pont) was added in an amount of 0.1% by weight based on the entire brown solution. The solution was filtered through a syringe filter having a pore size of 0.45 μm, thereby giving a composition B3 for a hole collecting layer.

Example 1-4

A composition B4 for a hole collecting layer was obtained in the same manner as in Example 1-1 except that the fluorine-based nonionic surfactant (FS-30, manufactured by Du Pont) was changed to a fluorine-based nonionic surfactant (FS-34, manufactured by Du Pont).

Example 1-5

A composition B5 for a hole collecting layer was obtained in the same manner as in Example 1-2 except that the fluorine-based nonionic surfactant (FS-30, manufactured by Du Pont) was changed to a fluorine-based nonionic surfactant (FS-34, manufactured by Du Pont).

Example 1-6

A composition B6 for a hole collecting layer was obtained in the same manner as in Example 1-3 except that the fluorine-based nonionic surfactant (FS-30, manufactured by Du Pont) was changed to a fluorine-based nonionic surfactant (FS-34, manufactured by Du Pont).

Example 1-7

A composition B7 for a hole collecting layer was obtained in the same manner as in Example 1-1 except that the fluorine-based nonionic surfactant (FS-30, manufactured by Du Pont) was changed to a fluorine-based nonionic surfactant (FN-1287, manufactured by DKS Co., Ltd.).

Example 1-8

A composition B8 for a hole collecting layer was obtained in the same manner as in Example 1-2 except that the fluorine-based nonionic surfactant (FS-30, manufactured by Du Pont) was changed to a fluorine-based nonionic surfactant (FN-1287, manufactured by DKS Co., Ltd.).

Example 1-9

A composition B9 for a hole collecting layer was obtained in the same manner as in Example 1-3 except that the fluorine-based nonionic surfactant (FS-30, manufactured by Du Pont) was changed to a fluorine-based nonionic surfactant (FN-1287, manufactured by DKS Co., Ltd.).

Example 1-10

In 12.1 g of distilled water, 250 mg of the polymethoxyaniline sulfonic acid obtained in Synthesis Example 1 and 125 mg of arylsulfonic acid compound A of the above formula (2-1) synthesized based on the description of WO 2006/025342 to prepare a brown solution having a concentration of 3.0% by weight. To the resultant brown solution, a fluorine-based nonionic surfactant (FN-1287, manufactured by DKS Co., Ltd.) was added in an amount of 0.1% by weight based on the entire brown solution. The solution was filtered through a syringe filter having a pore size of 0.45 μm, thereby giving a composition B10 for a hole collecting layer.

Example 1-11

A hole collecting layer B11 was obtained in the same manner as in Example 1-9 except that the amount of the fluorine-based nonionic surfactant (FN-1287, manufactured by DKS Co., Ltd.) added was changed to 0.5% by weight.

Example 1-12

To 4.41 g of aquaPASS-01X (manufactured by Mitsubishi Chemical Corporation, 5.1% by weight aqueous solution), 3.20 g of distilled water and 7.39 g of ethanol were added to prepare a brown solution having a concentration of 1.5% by weight. To the resultant brown solution, a fluorine-based nonionic surfactant (FN-1287, manufactured by DKS Co., Ltd.) was added in an amount of 0.5% by weight based on the entire brown solution. The solution was filtered through a syringe filter having a pore size of 0.45 μm, thereby giving a composition for layering B12.

Example 1-13

In 6.13 g of distilled water, 100 mg of arylsulfonic acid compound A of the above formula (2-1) synthesized based on the description of WO 2006/025342 was dissolved, and 3.92 g of aquaPASS-01X (manufactured by Mitsubishi Chemical Corporation, 5.1% by weight aqueous solution) and 9.85 g of ethanol were added to prepare a brown solution having a concentration of 1.5% by weight. To the resultant brown solution, a fluorine-based nonionic surfactant (FN-1287, manufactured by DKS Co., Ltd.) was added in an amount of 0.7% by weight based on the entire brown solution. The solution was filtered through a syringe filter having a pore size of 0.45 μm, thereby giving a composition for layering B13.

Example 1-14

In 7.99 g of distilled water, 200 mg of arylsulfonic acid compound A of the above formula (2-1) synthesized based on the description of WO 2006/025342 was dissolved, and 1.96 g of aquaPASS-01X (manufactured by Mitsubishi Chemical Corporation, 5.1% by weight aqueous solution) and 9.85 g of ethanol were added to prepare a brown solution having a concentration of 1.5% by weight. To the resultant brown solution, a fluorine-based nonionic surfactant (FS-35, manufactured by Du Pont, 25% by weight aqueous solution) was added in an amount of 4.0% by weight based on the entire brown solution. The solution was filtered through a syringe filter having a pore size of 0.45 μm, thereby giving a composition for layering B14.

Example 1-15

In 7.99 g of distilled water, 200 mg of a 20% by weight aqueous solution of 1,3,6-naphthalenetrisulfonic acid (manufactured by Toyama Pure Chemical Industries, Ltd., FUNCHEM-NTSH (20)) was dissolved, and 1.96 g of aquaPASS-01X (manufactured by Mitsubishi Chemical Corporation, 5.1% by weight aqueous solution) and 9.85 g of ethanol were added to prepare a brown solution having a concentration of 1.5% by weight. To the resultant brown solution, a fluorine-based nonionic surfactant (FN-1287, manufactured by DKS Co., Ltd.) was added in an amount of 1.0% by weight based on the entire brown solution. The solution was filtered through a syringe filter having a pore size of 0.45 μm, thereby giving a composition B15 for a hole collecting layer.

Example 1-16

In 7.99 g of distilled water, 200 mg of a 20% by weight aqueous solution of polystyrenesulfonic acid (manufactured by Toyama Pure Chemical Industries, Ltd., FUNCHEM-PSSH(20), molecularweight: 14,000) was dissolved, and 1.96 g of aquaPASS-01X (manufactured by Mitsubishi Chemical Corporation, 5.1% by weight aqueous solution) and 9.85 g of ethanol were added to prepare a brown solution having a concentration of 1.5% by weight. To the resultant brown solution, a fluorine-based nonionic surfactant (FN-1287, manufactured by DKS Co., Ltd.) was added in an amount of 0.5% by weight based on the entire brown solution. The solution was filtered through a syringe filter having a pore size of 0.45 μm, thereby giving a composition B16 for a hole collecting layer.

[4] Production 1 of Organic Thin-Film Solar Cell

Example 2-1

A 20 mm×20 mm glass substrate in which an ITO transparent conductive layer to be a cathode was patterned in a stripe shape of 2 mm×20 mm was subjected to UV/ozone treatment for 15 minutes. On this substrate, a solution of zinc oxide (manufactured by Genes' Ink) to be an electron collecting layer was added dropwise, and a film was formed by spin coating. The film thickness of the electron collecting layer was about 20 nm. Thereafter, in a glove box replaced with an inert gas, the solution A1 obtained in Preparation Example 1 was added dropwise onto the formed electron collecting layer, and a film was formed by spin coating to form an active layer.

Next, the composition B1 for a hole collecting layer prepared in Example 1-1 was applied onto the active layer by spin coating, and then heated at 120° C. for 10 minutes using a hot plate, thereby forming a hole collecting layer. The film thickness of the hole collecting layer was about 30 nm.

Finally, the laminated substrate was placed in a vacuum deposition apparatus, and evacuation was performed until the degree of vacuum in the apparatus became $1\times10^{-3}$ Pa or less. Then, a silver layer to be an anode was vapor-deposited at a thickness of 80 nm by resistance heating, thereby producing an inverse lamination type OPV element in which the area of a portion where the stripe-shaped ITO layer and the silver layer intersected was 2 mm×2 mm.

Examples 2-2 to 2-11

Inverse lamination type OPV elements were produced in the same manner as in Example 2-1 except that the compositions B2 to B11 for a hole collecting layer were used instead of the composition B1 for a hole collecting layer.

Example 2-12

A 20 mm×20 mm glass substrate in which an ITO transparent conductive layer to be a cathode was patterned in a stripe shape of 2 mm×20 mm was subjected to UV/ozone treatment for 15 minutes. On this substrate, a solution of zinc oxide (manufactured by Genes' Ink) to be an electron collecting layer was added dropwise, and a film was formed by spin coating. The film thickness of the electron collecting layer was about 20 nm. Thereafter, in a glove box replaced with an inert gas, the solution A1 obtained in Preparation Example 1 was added dropwise onto the formed electron collecting layer, and a film was formed by spin coating to form an active layer.

Next, the composition B12 for a hole collecting layer prepared in Example 1-12 was applied onto the active layer by spin coating, and then dried at room temperature to form a hole collecting layer. The film thickness of the hole collecting layer was about 50 nm.

Finally, the laminated substrate was placed in a vacuum deposition apparatus, and evacuation was performed until the degree of vacuum in the apparatus became $1\times10^{-3}$ Pa or less. Then, a silver layer to be an anode was vapor-deposited at a thickness of 80 nm by resistance heating, thereby producing an inverse lamination type OPV element in which the area of a portion where the stripe-shaped ITO layer and the silver layer intersected was 2 mm×2 mm. Further, annealing treatment was performed by heating at 60° C. for 30 minutes using a hot plate.

Examples 2-13 to 2-16

Inverse lamination type OPV elements were produced in the same manner as in Example 2-12 except that the compositions B13 to B16 for a hole collecting layer were used instead of the composition B12 for a hole collecting layer.

Comparative Example 2-1

An inverse lamination type OPV element was produced in the same manner as in Example 2-1 except that the composition B1 for a hole collecting layer was not used.

[5] Evaluation of Properties

The short circuit current density (Jsc[mA/cm$^2$]), the open circuit voltage (Voc[V]), the fill factor (FF) and PCE [%] were evaluated for each of the OPV elements produced in Examples 2-1 to 2-16 and Comparative Example 2-1 described above. The results are shown in Table 1.

The PCE [%] was calculated based on the following equation.

PCE [%]=Jsc[mA/cm$^2$]×Voc [V]×FF÷incident light intensity (100 [mW/cm$^2$])×100

TABLE 1

| | $J_{sc}$ (mA/cm$^2$) | $V_{oc}$ (V) | FF | PCE (%) |
|---|---|---|---|---|
| Example 2-1 | 5.2 | 0.72 | 0.40 | 1.5 |
| Example 2-2 | 10.3 | 0.70 | 0.53 | 3.9 |
| Example 2-3 | 10.6 | 0.76 | 0.54 | 4.3 |
| Example 2-4 | 9.1 | 0.76 | 0.55 | 3.8 |
| Example 2-5 | 10.6 | 0.72 | 0.55 | 4.2 |
| Example 2-6 | 10.9 | 0.76 | 0.54 | 4.5 |
| Example 2-7 | 8.3 | 0.76 | 0.53 | 3.3 |
| Example 2-8 | 10.0 | 0.68 | 0.51 | 3.5 |
| Example 2-9 | 10.7 | 0.76 | 0.53 | 4.3 |
| Example 2-10 | 9.3 | 0.75 | 0.52 | 3.7 |
| Example 2-11 | 11.7 | 0.76 | 0.59 | 5.2 |
| Example 2-12 | 10.8 | 0.68 | 0.61 | 4.5 |
| Example 2-13 | 11.9 | 0.79 | 0.64 | 6.0 |
| Example 2-14 | 11.9 | 0.80 | 0.63 | 6.0 |
| Example 2-15 | 11.9 | 0.80 | 0.67 | 6.4 |
| Example 2-16 | 11.9 | 0.79 | 0.63 | 5.8 |
| Comparative Example 2-1 | 11.7 | 0.28 | 0.43 | 1.4 |

As shown in Table 1, it can be seen that an inverse lamination type OPV element having good properties can be obtained by using the composition for a hole collecting layer according to the present invention.

[6] Production 2 of Composition for Hole Collecting Layer

Example 1-17

In 13.0 g of distilled water and 13.0 g of ethanol, 89.3 mg of arylsulfonic acid compound A of the above formula (2-1) synthesized according to the description of WO 2006/025342 and 179 mg of polymethoxyaniline sulfonic acid obtained in Synthesis Example 1 were dissolved, and 536 mg of tetraethoxysilane was added to prepare a brown solution having a concentration of 3.0% by weight. To the resultant brown solution, a fluorine-based nonionic surfactant (FS-35, manufactured by Du Pont) was added in an amount of 0.5% by weight based on the entire brown solution. The solution was filtered through a syringe filter having a pore size of 0.45 μm, thereby giving a composition B17 for a hole collecting layer.

Example 1-18

In 13.0 g of distilled water and 13.0 g of ethanol, 61.9 mg of arylsulfonic acid compound A of the above formula (2-1) synthesized according to the description of WO 2006/025342 and 124 mg of polymethoxyaniline sulfonic acid obtained in Synthesis Example 1 were dissolved, and 619 mg of tetraethoxysilane was added to prepare a brown solution having a concentration of 3.0% by weight. To the resultant brown solution, a fluorine-based nonionic surfactant (FS-35, manufactured by Du Pont) was added in an amount of 0.5% by weight based on the entire brown solution. The solution was filtered through a syringe filter having a pore size of 0.45 μm, thereby giving a composition B18 for a hole collecting layer.

Example 1-19

A hole collecting layer B19 was obtained in the same manner as in Example 1-17 except that the fluorine-based nonionic surfactant was changed to FN-1287 (manufactured by DKS Co., Ltd.) and that the amount of the fluorine-based nonionic surfactant added was changed to 0.3% by weight based on the entire brown solution.

Example 1-20

A hole collecting layer B20 was obtained in the same manner as in Example 1-18 except that the fluorine-based nonionic surfactant was changed to FN-1287 (manufactured by DKS Co., Ltd.) and that the amount of the fluorine-based nonionic surfactant added was changed to 0.3% by weight based on the entire brown solution.

Example 1-21

A hole collecting layer B21 was obtained in the same manner as in Example 1-19 except that the amount of the fluorine-based nonionic surfactant (FN-1287, manufactured by DKS Co., Ltd.) added was changed to 0.5% by weight.

Example 1-22

A hole collecting layer B22 was obtained in the same manner as in Example 1-20 except that the amount of the fluorine-based nonionic surfactant (FN-1287, manufactured by DKS Co., Ltd.) added was changed to 0.5% by weight.

[7] Production 2 of Organic Thin-Film Solar Cell

Examples 2-17 to 2-22

An inverse lamination type OPV element was produced in the same manner as in Example 2-1 except that the compositions B17 to B22 for a hole collecting layer were used instead of the composition B1 for a hole collecting layer.

[8] Evaluation of Properties

The short circuit current density (Jsc [mA/cm$^2$]), the open circuit voltage (Voc [V]), the fill factor (FF) and PCE [%]

were evaluated for each of the OPV elements produced in Examples 2-17 to 2-22 described above. The results are shown in Table 2. The results of Comparative Example 2-1 described above are also shown.

The PCE [%] was calculated based on the following equation.

PCE [%]=Jsc [mA/cm$^2$]×Voc [V]×FF÷incident light intensity (100 [mW/cm$^2$])×100

TABLE 2

|  | $J_{sc}$ (mA/cm$^2$) | $V_{oc}$ (V) | FF | PCE (%) |
| --- | --- | --- | --- | --- |
| Example 2-17 | 10.0 | 0.76 | 0.56 | 4.3 |
| Example 2-18 | 10.1 | 0.77 | 0.46 | 3.6 |
| Example 2-19 | 10.1 | 0.76 | 0.56 | 4.3 |
| Example 2-20 | 9.9 | 0.78 | 0.45 | 3.5 |
| Example 2-21 | 9.9 | 0.72 | 0.55 | 4.0 |
| Example 2-22 | 10.4 | 0.76 | 0.51 | 4.1 |
| Comparative Example 2-1 | 11.7 | 0.28 | 0.43 | 1.4 |

As shown in Table 2, it can be seen that an inverse lamination type OPV element having good properties can be obtained by using the composition for a hole collecting layer according to the present invention.

[9] Preparation of Hole Collecting Layer and Evaluation of Water Resistance

Example 3-1

On an ITO substrate, the composition B12 for a hole collecting layer prepared in Example 1-12 was applied by spin coating. The substrate was heated at 120° C. for 10 minutes using a hot plate to form a hole collecting layer.

Examples 3-2 to 3-6

Hole collecting layers were formed in the same manner as in Example 3-1 except that the compositions B13 to B17 for a hole collecting layer were used instead of the composition B12 for hole collecting layer.

Five drops of water were added dropwise to each of the hole collecting layers obtained above, and spin coating was performed, followed by drying at 120° C. for 10 minutes. The film thickness and Ip value of the respective hole collecting layers before and after the water resistance test were measured, and the residual film ratio was calculated for the film thickness change. The results are shown in Table 3.

TABLE 3

|  | Ip before water resistance test (eV) | Ip after water resistance test (eV) | Film thickness before water resistance test (nm) | Film thickness after water resistance test (nm) | Residual film rate (%) |
| --- | --- | --- | --- | --- | --- |
| Example 3-1 | 5.3 | 5.3 | 31.4 | 19.7 | 63 |
| Example 3-2 | 5.3 | 5.3 | 27.0 | 26.4 | 98 |
| Example 3-3 | 5.3 | 5.3 | 30.0 | 31.0 | 103 |
| Example 3-4 | 5.3 | 5.4 | 26.0 | 22.9 | 88 |
| Example 3-5 | 5.4 | 5.4 | 32.7 | 18.2 | 56 |
| Example 3-6 | 5.4 | 5.4 | 25.6 | 20.6 | 80 |

As shown in Table 3, it can be seen that, in the thin film produced from the composition of the present invention, a half or more of the film remains even after the water resistance test, and that Ip is substantially constant before and after the water resistance test.

[10] Evaluation of Light Resistance Test

Examples 4-1 to 4-5

After evaluation of the initial properties of the respective OPV elements produced in Examples 2-12 to 2-16 described above, there was measured the conversion efficiency after irradiation with artificial sunlight for 24 hours at an illuminance of 100 mW/cm$^2$ with a solar cell endurance test system (manufactured by Seric Co., Ltd., SML-2K1AV4) using a 2000 W metal halide lamp. The conversion efficiency retention rate was calculated using the following formula. The initial properties and conversion efficiency retention rate are shown in Table 4.

Conversion efficiency retention rate (%)=conversion efficiency after light resistance test÷initial conversion efficiency×100

TABLE 4

|  | Initial conversion efficiency (%) | Conversion efficiency after light resistance test (%) | Conversion efficiency maintenance rate (%) |
| --- | --- | --- | --- |
| Example 4-1 | 4.9 | 3.1 | 63 |
| Example 4-2 | 6.3 | 4.2 | 66 |
| Example 4-3 | 6.3 | 4.1 | 66 |
| Example 4-4 | 6.4 | 4.1 | 65 |
| Example 4-5 | 6.1 | 2.9 | 47 |

As shown in Table 4, it can be seen that the OPV element produced from the composition of the present invention maintains the HTL properties even after the light resistance test, and exhibits high light resistance.

[11] Preparation 2 of Active Layer Composition

Preparation Example 1

In a sample vial containing 40 mg of P3HT (manufactured by Merck) and 36 mg of PC$_{61}$BM (manufactured by Frontier Carbon Corporation, product name: nanom spectra E 100), 2.0 mL of chlorobenzene was added, and the vial contents were stirred on a hot plate at 80° C. for 15 hours. The solution was allowed to cool to room temperature to obtain a solution B1 (active layer composition).

[12] Production 3 of Organic Thin-Film Solar Cell

Example 5-1

An inverse lamination type OPV element was produced in the same manner as in Example 2-12 except that the active layer composition B1 were used instead of the active layer composition A1.

Example 5-2

An inverse lamination type OPV element was produced in the same manner as in Example 5-1 except that the composition B13 for a hole collecting layer were used instead of the composition B12 for a hole collecting layer.

[13] Evaluation of Properties

The short circuit current density (Jsc [mA/cm²]), the open circuit voltage (Voc [V]), the fill factor (FF) and PCE [%] were evaluated for each of the OPV elements produced in Examples 5-1 to 5-2 described above. The results are shown in Table 5.

The PCE [%] was calculated based on the following equation.

PCE [%]=Jsc [mA/cm²]×Voc [V]×FF÷incident light intensity (100 [mW/cm²])×100

TABLE 5

|  | $J_{sc}$ (mA/cm²) | $V_{oc}$ (V) | FF | PCE (%) |
|---|---|---|---|---|
| Example 5-1 | 5.6 | 0.59 | 0.62 | 2.0 |
| Example 5-2 | 6.5 | 0.60 | 0.60 | 2.3 |

As shown in Table 5, it can be seen that, by using the composition for a hole collecting layer according to the present invention, the HTL properties are exhibited in the reverse type OPV element even when P3HT, which is a general active layer, is used.

The invention claimed is:

1. A composition for a hole collecting layer of an organic photovoltaic element, comprising: a charge transporting substance composed of a polyaniline derivative represented by formula (1); a fluorine-based surfactant; an alkoxysilane; and a solvent:

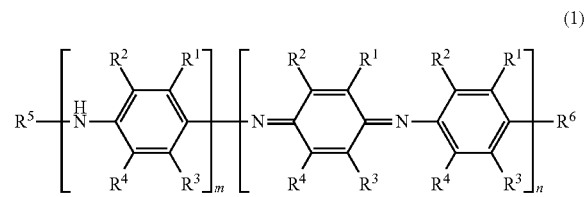

(1)

wherein R¹ to R⁶ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, an aralkyl group having 7 to 20 carbon atoms or an acyl group having 1 to 20 carbon atoms, provided that one of R¹ to R⁴ is a sulfonic acid group, and that at least one of the remaining R¹ to R⁴ is an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms or an aralkyl group having 7 to 20 carbon atoms, and m and n are numbers satisfying 0≤m≤1 and 0≤n≤1, respectively, and m+n=1, wherein m and n represent an average value of the molar ratio of each repeating unit in the polyaniline derivative, wherein the alkoxysilane is at least one selected from the group consisting of tetraethoxysilane and tetramethoxysilane.

2. The composition for a hole collecting layer of an organic photovoltaic element according to claim 1, wherein the fluorine-based surfactant is a fluorine-based nonionic surfactant.

3. The composition for a hole collecting layer of an organic photovoltaic element according to claim 2, wherein the fluorine-based nonionic surfactant is at least one selected from the following formulas (A2) and (B2):

$$R_fCOO(CH_2CH_2O)_nH \quad (A2)$$

$$R_f(CH_2CH_2O)_nH \quad (B2)$$

$R_f(CH_2CH_2O)_nH$ (B2) wherein Rf each independently represents a perfluoroalkyl group having 1 to 40 carbon atoms, and n each independently represents an integer of 1 to 20.

4. The composition for a hole collecting layer of an organic photovoltaic element according to claim 1, wherein R¹ is a sulfonic acid group, and R⁴ is an alkoxy group having 1 to 20 carbon atoms.

5. The composition for a hole collecting layer of the organic photovoltaic element according to claim 1, comprising an electron accepting dopant substance different from the polyaniline derivative represented by formula (1).

6. The composition for a hole collecting layer of an organic photovoltaic element according to claim 5, wherein the electron accepting dopant substance is a Brønsted acid.

7. The composition for a hole collecting layer of an organic photovoltaic element according to claim 6, wherein the electron accepting dopant substance is an arylsulfonic acid compound represented by formula (2):

(2)

wherein X represents O, A represents a naphthalene ring or an anthracene ring, B represents a divalent to tetravalent perfluorobiphenyl group, l represents the number of sulfonic acid groups bonded to A and is an integer satisfying 1≤l≤4, and q represents the number of bonds between B and X and is an integer satisfying 2 to 4.

8. The composition for a hole collecting layer of an organic photovoltaic element according to claim 1, wherein the solvent includes one or more solvents selected from alcohol solvents and water.

9. The composition for a hole collecting layer of an organic photovoltaic element according to claim 1, wherein the organic photovoltaic element is an organic thin-film solar cell, a dye sensitized solar cell or an optical sensor.

10. A hole collecting layer comprising the composition for a hole collecting layer of an organic photovoltaic element according to claim 1.

11. An organic photovoltaic element comprising the hole collecting layer according to claim 10.

12. An organic photovoltaic element comprising the hole collecting layer according to claim 10 and an active layer provided so as to be in contact therewith.

13. The organic photovoltaic element according to claim 11 or 12, wherein the active layer includes a fullerene derivative.

14. The organic photovoltaic element according to claim 11 or 12, wherein the active layer includes a polymer containing a thiophene skeleton in its main chain.

15. The organic photovoltaic element according to claim 11 or 12, wherein the active layer includes a fullerene derivative and a polymer containing a thiophene skeleton in its main chain.

16. The organic photovoltaic element according to claim 11, which is an inverse lamination type.

17. The organic photovoltaic element according to claim 11, wherein the organic photovoltaic element is an organic thin-film solar cell or an optical sensor.

18. The organic photovoltaic element according to claim 11, which has a top anode structure.

19. A charge transporting composition comprising: a charge transporting substance composed of a polyaniline derivative represented by formula (1); an electron accepting dopant substance different from the polyaniline derivative represented by formula (1); a fluorine-based surfactant; an alkoxysilane; and a solvent:

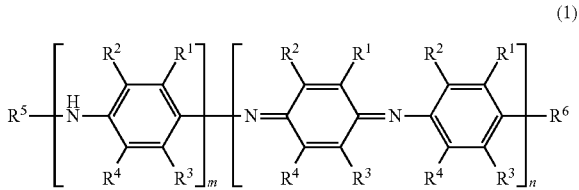

(1)

wherein $R^1$ to $R^6$ each independently represent a hydrogen atom, a halogen atom, a nitro group, a cyano group, a sulfonic acid group, an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms, an aralkyl group having 7 to 20 carbon atoms or an acyl group having 1 to 20 carbon atoms, provided that one of $R^1$ to $R^4$ is a sulfonic acid group, and that at least one of the remaining $R^1$ to $R^4$ is an alkoxy group having 1 to 20 carbon atoms, a thioalkoxy group having 1 to 20 carbon atoms, an alkyl group having 1 to 20 carbon atoms, an alkenyl group having 2 to 20 carbon atoms, an alkynyl group having 2 to 20 carbon atoms, a haloalkyl group having 1 to 20 carbon atoms, an aryl group having 6 to 20 carbon atoms or an aralkyl group having 7 to 20 carbon atoms, and m and n are numbers satisfying 0≤m≤1 and 0≤n≤1, respectively, and m+n=1, wherein m and n represent an average value of the molar ratio of each repeating unit in the polyaniline derivative, wherein the alkoxysilane is at least one selected from the group consisting of tetraethoxysilane and tetramethoxysilane.

20. The charge transporting composition according to claim 19, wherein the electron accepting dopant substance is an arylsulfonic acid compound represented by formula (2):

(2)

wherein X represents O, A represents a naphthalene ring or an anthracene ring, B represents a divalent to tetravalent perfluorobiphenyl group, l represents the number of sulfonic acid groups bonded to A and is an integer satisfying 1≤l≤4, and q represents the number of bonds between B and X and is an integer satisfying 2 to 4.

21. The composition for a hole collecting layer of an organic photovoltaic element according to claim 1, further comprising at least one high-viscosity organic solvent having a viscosity of 10 mPa·s to 200 mPa·s.

22. The composition for a hole collecting layer of an organic photovoltaic element according to claim 21, wherein the at least one high-viscosity organic solvent is selected from the group consisting of ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol.

23. The composition for a hole collecting layer of an organic photovoltaic element according to claim 19, further comprising at least one high-viscosity organic solvent having a viscosity of 10 mPa·s to 200 mPa·s.

24. The composition for a hole collecting layer of an organic photovoltaic element according to claim 23, wherein the at least one high-viscosity organic solvent is selected from the group consisting of ethylene glycol, 1,3-octylene glycol, diethylene glycol, dipropylene glycol, triethylene glycol, tripropylene glycol, 1,3-butanediol, 2,3-butanediol, 1,4-butanediol, propylene glycol and hexylene glycol.

* * * * *